United States Patent [19]

Cauwenberghs et al.

[11] Patent Number: 5,258,759
[45] Date of Patent: Nov. 2, 1993

[54] METHOD AND APPARATUS FOR MONOTONIC ALGORITHMIC DIGITAL-TO-ANALOG AND ANALOG-TO-DIGITAL CONVERSION

[75] Inventors: Gert Cauwenberghs, Pasadena; Amnon Yariv, San Marino, both of Calif.

[73] Assignee: California Institute of Technology, Pasadena, Calif.

[21] Appl. No.: 962,451

[22] Filed: Oct. 16, 1992

[51] Int. Cl.$^5$ .................. H03M 1/66; H03M 1/12
[52] U.S. Cl. ........................ 341/150; 341/172
[58] Field of Search ............ 341/150, 172, 144, 155

[56] References Cited

U.S. PATENT DOCUMENTS

| | | | |
|---|---|---|---|
| 4,065,766 | 12/1977 | Butler et al. | 341/172 |
| 4,070,667 | 1/1978 | Eichelberger | 341/172 X |
| 4,072,939 | 2/1978 | Heller et al. | 341/172 X |
| 4,144,526 | 3/1979 | Wotruba | 341/172 X |

*Primary Examiner*—Sharon D. Logan
*Attorney, Agent, or Firm*—Blakely, Sokoloff, Taylor & Zafman

[57] ABSTRACT

The present invention provides a compact and robust architecture and a corresponding method to implement a monotonic algorithmic D/A converter that processes the bits of the digital input in the order from MSB to LSB, and a successive approximation A/D converter employing the intermediate conversion results of this D/A converter. The invention is aimed at applications requiring a dense integration in general VLSI technologies of multiple D/A and A/D converters, where individual trimming of components to compensate for component offsets and mismatches is virtually impossible. The architecture comprises four charge holding components, one switch for charge sharing, two bi-directional replication elements for charge storage and recall, and one comparator. Also described is an efficient way of performing pseudo-logarithmic compression of conversion values merely by adjusting the relative sizes of two of the charge holding components.

16 Claims, 9 Drawing Sheets

METHOD AND APPARATUS FOR MONOTONIC ALGORITHMIC DIGITAL-TO-ANALOG AND ANALOG-TO-DIGITAL CONVERSION

BACKGROUND OF THE INVENTION

Field of the Invention

The present invention relates to converting digital information to analog information and vice versa. More particularly, the present invention relates to a compact architecture, suitable for use in semiconductor technology to implement a robust monotonic algorithmic digital-to-analog converter and a corresponding successive approximation analog-to-digital converter.

Art Background

Recent advances in process technology and circuit methodology have enabled the integration of complex systems performing massive computational and signal processing tasks, both in the analog an digital domains. Of growing interest today are hybrid analog/digital systems, such as digital imagers, which require vast parallel data conversions between the analog and digital domains. It is apparent that a robust, space-efficient and versatile technology for data conversion is desirable.

Traditionally, an algorithmic digital-to-analog (D/A) converter converts a digital word to its corresponding analog quantity, such as a voltage, in a sequence starting with the least significant bit (LSB) of the digital word and terminating with the most significant bit (MSB). Algorithmic D/A converters that have been implemented using CMOS technology have most commonly processed intermediate values of the conversion voltage by storing the value on a single capacitor, then, sequentially sharing its charge with a second capacitor of equal size preset to either one of two reference voltages depending on the state of the next succeeding bit to be converted, thereby accumulating an amount of charge representative of the digital word being converted. Although this technique leads to a compact design, the main disadvantage is poor accuracy of conversion when the capacitors are not perfectly matched and linear. To obtain an integral non-linearity (INL) and differential non-linearity (DNL) of at most one LSB, the full-range non-linearity of the capacitance and the deviation in size between both capacitors needs to be less than 1 out of $2^n$, with n being the length of the digital word to be converted.

Several compensation schemes have been suggested but these result in either a larger circuit size or a higher clock waveform complexity and lower bandwidth. See, for example, C.-C. Shih, and P. R. Gray, "*Reference Refreshing Cyclic Analog-to-Digital and Digital-to-Analog Converters,*" IEEE J. Solid-State Circuits, vol. 21(4), pp. 544–554, 1986.

Another disadvantage to the traditional algorithmic D/A converters is that the digital word is processed in a bit sequence from the LSB to the MSB, whereas for analog-to-digital conversion the bits of the digital word necessarily proceed from the MSB to the LSB. The intermediate D/A conversion results cannot serve as successive approximations for A/D conversion because the order in which the bits are processed are different for the two conversions. In order to generate intermediate D/A conversion voltages compatible with the successive approximations of the corresponding A/D conversion, the sequence of bits in the D/A conversion needs to start with the MSB and to terminate with the LSB. Using a traditional algorithmic D/A converter in a successive approximation A/D converter would require complete partial D/A conversions for each A/D bit converted, necessitating a long conversion cycle and a storage register for previous bits. A cyclic A/D converter avoids this problem by utilizing an algorithm which avoids the need for successive approximations. As a result, the cyclic A/D converter does not inherently perform D/A conversion, and the final analog approximation value, representative of the converted digital word, is not explicitly available. This is a disadvantage in certain applications, requiring bi-directional conversion between the analog and digital domains. Further, existing cyclic A/D converters suffer the same accuracy problems as algorithmic D/A converters, necessitating similar compensation schemes to alleviate the severe impact of component mismatches. See, for instance, the above-mentioned article, and also H. Onodera, T. Tateishi and K. Tamaru, "*A Cyclic A/D Converter That Does Not Require Ratio-Matched Components,*" IEEE J. Solid-State Circuits, vol. 23(1), pp. 152–158, 1988.

SUMMARY OF THE INVENTION

It is an object of the present invention to provide an algorithmic D/A converter which processes the bits of a digital word in the order from the MSB to the LSB.

It is also an object of the present invention to provide a successive approximation A/D converter that employs the intermediate conversion results of the above D/A converter.

It is a further object of the present invention to provide a single apparatus suitable for serving both functions of D/A and A/D conversion.

It is another object of the present invention to provide a method of A/D and D/A conversion which yields monotonicity in the conversion characteristics regardless of device mismatches and non-linearities.

It is yet another object of the present invention to provide a simple method of pseudo-logarithmic compression inherent to the D/A and A/D conversion method without requiring additional components or procedures.

These and other objects of the present invention are provided in a system suitable for compact integration in dense VLSI architectures, allowing for simple control and interfacing while maintaining fast operation. The D/A and A/D converters utilize a number of elements with analogues in various technology environments. The elements include four charge-holding means, one switch for charge sharing, and two "bi-directional replication elements" for charge storage and recall. A specific embodiment of the bi-directional replication element suitable for implementation in CMOS technology is provided.

BRIEF DESCRIPTION OF THE DRAWINGS

The objects, features and advantages of the present invention will be apparent from the following detailed description in which.

DETAILED DESCRIPTION OF THE INVENTION

A method and apparatus for digital-to-analog and analog-to-digital conversion are described below. It should be borne in mind that the present invention as developed below may transcend various implementation technologies in different VLSI environments. To cover the apparatus of the invention in as complete a range of embodiments as possible, some components well-known in the art and functional blocks which allow for countless trivial alternative embodiments have not been specified in detailed structural form, leaving the choice of their specific implementations to the designer. As an example, a well-defined embodiment implementing the functional specification invention in a CMOS environment is included, and experimental results from such a structure are presented.

Conversion Algorithm

Traditional algorithmic D/A converters process a digital word in a sequence starting with the LSB and ending with the MSB. The method in accordance with the present invention is to perform D/A conversions wherein the MSB is processed first and the LSB last. For such a method to proceed in an algorithmic fashion, every intermediate state $U_i$ in the conversion process for i from 0 through n corresponds to the partial D/A conversion of the first i bits in the digital word, representing a spectrum of $2^i$ equally spaced discrete analog values. The spectra of discrete values for the intermediate states $U_i$ necessarily follow a tree structure from the initial to the final conversion state, schematically depicted in FIG. 1 for a bit length of n=4. Each of the values for any given intermediate state $U_i$ branches into two possible values for the subsequent state $U_{i+1}$, the lower one corresponding to a "0" value of the bit being converted, and the higher one to a "1". The arrows in the graph indicate an algorithmic means of constructing the value of the state $U_{i+1}$ from the values of two previous states, generated in previous iterations of the conversion process. The solid arrows denote the contribution to the value of state $U_i$ by the value of the previous state $U_{i-1}$, and the broken arrows denote the contribution to the value of $U_i$ by the value of one of the earlier states, selected by the polarity of bit i. As the graph suggests, the value of $U_i$ is constructed simply by averaging the values of the two selected generating states.

Figure 1:
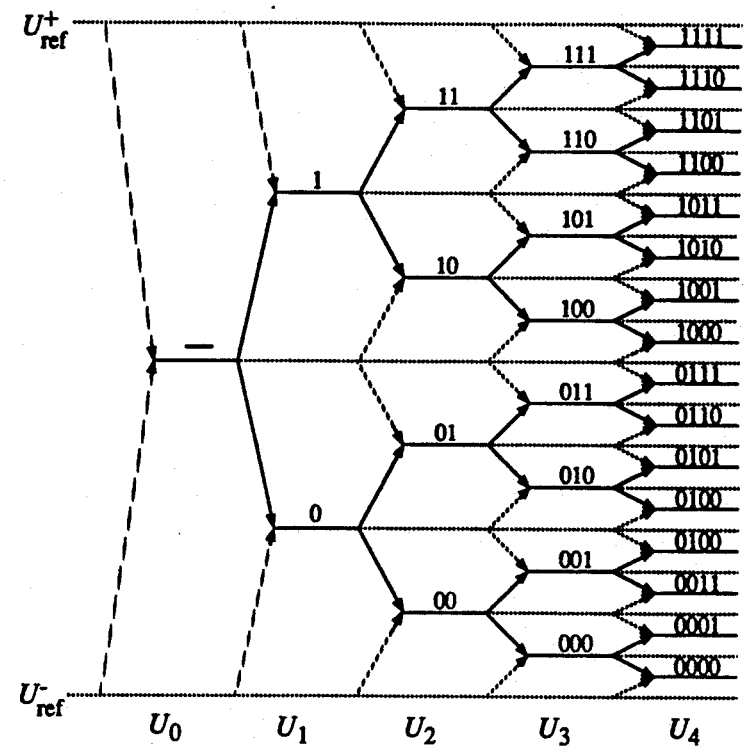
FIG. 1 shows the tree structure tracing the sequences of intermediate states for digital-to-analog conversion in accordance with the method of the present invention.

In accordance with the structure illustrated by FIG. 1, a practical conversion algorithm can be formulated, involving three analog "registers" U, U+ and U− that are updated at every bit cycle i. To do so, it is necessary to introduce initialization values $U_{ref}+$ and $U_{ref}−$ defining the conversion range of the analog domain; $U_{ref}+$ and $U_{ref}−$ roughly correspond to the upper and lower limit of the analog spectrum respectively. The resulting D/A conversion algorithm can be defined in symbolic form as follows:

a) Initialization (i=0):
Preset $U_0+$ to $U_{ref}+$ and $U_0−$ to $U_{ref}−$;
Set $U_0$ halfway in between $U_0+$ and $U_0−$;
b) Algorithmic Iteration (i−1 to i, from i=1 to n):
If bit i is "1": set $U_i+$ to $U_{i-1}+$ and $U_i−$ to $U_{i-1}$;
"0": set $U_i+$ to $U_{i-1}$ and $U_i−$ to $U_{i-1}−$;
Set $U_i$ halfway in between $U_i+$ and $U_i−$;
c) Termination (i=n):
The final D/A conversion result is given by $U_n$.

Figure 2:
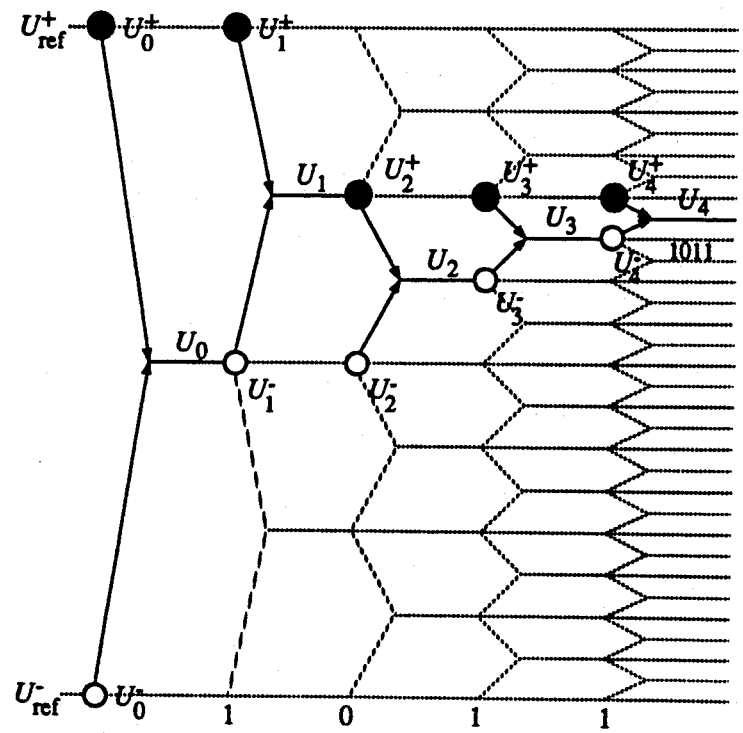
FIG. 2 shows a sequence of intermediate steps in processing a particular example following the digital-to-analog conversion method in accordance with the present invention.

As shown in the example illustrated by FIG. 2 in which the digital value 1011 is converted to its corresponding analog value, the intermediate analog states evolve from an initial value halfway between $U_{ref}−$ and $U_{ref}+$ to the final $U_4$ value. This conversion is monotonic in nature because it implements the branching tree structure of FIG. 1, preserving the proper sequence in the analog spectra for all of the intermediate states $U_i$ by due selection of the values for the pivots $U_i−$ and $U_i+$. This guaranteed monotonicity is true even if the intermediate states $U_i$ are not set exactly halfway in between the pivots $U_i−$ and $U_i+$, provided the deviation from the medium value is consistent.

Apparatus and Method

Figure 3:
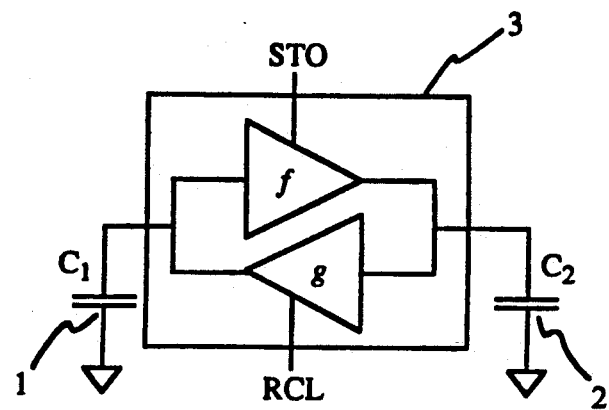
FIG. 3 illustrates schematically the concept of a bi-directional replication element which is utilized in accordance with the present invention.

The present invention may be implemented in a variety of VLSI technologies, such as CMOS or CCD, each of which will vary the specific component structure. Because the specific technology chosen to implement the invention is irrelevant to the operation, the functional elements are defined in the following general form:

a) A "charge holding means". The "size" or area of the device relates the total stored electrical charge to the planar charge density. In a capacitive context, the term "charge holding means" refers to one of the terminals of a capacitor, with the other terminal shorted at a fixed potential. The voltage across the capacitor is directly related to the amount of charge held by its capacitance. For simplicity, the term "charge holding means" will be substituted for the term "capacitor" in the further description below, nevertheless bearing in mind the generality of the device hereby referred to.

b) An element, called a "switch", for uniting the charge held by two capacitors whenever the switch is active, effectively redistributing the charge over both capacitors with equal charge density. The partition of the total charge among the two capacitors is determined by the ratio of the sizes of the two capacitors.

c) An element, called a "Bi-directional Replication Element" (BRE). FIG. 3 illustrates a BRE 3 coupled to two capacitors 1 and 2. The BRE 3 has two active states of operation: "store" (STO) and "recall" (RCL). In the STO mode, the charge $Q_1$ on capacitor 1 is sensed non-destructively and stored in the form of a charge $Q_2$ on capacitor 2. The charge relationship is such that $Q_2 = f(Q_1)$ with f a strictly monotonic function. Similarly, in the RCL mode, the stored charge $Q_2$ on capacitor 2 is sensed non-destructively and recalled as charge $Q_1$ on capacitor 1. Likewise, $Q_1 = g(Q_2)$ with g strictly monotonic. No functional form is specified for the transfer functions f and g, except the requirement that the recall error, that is the change in charge $Q_1$ after successive STO and RCL operations, be zero: $Q_2 = f(Q_1)$ has to imply $Q_1 = g(Q_2)$ and vice versa. In practice, f and g do not need to be identity mappings, and decreasing functions or nonlinear mappings are allowed as well. For practical purposes, f and g may account for transfer offsets in an otherwise perfect replication process due to circuit non-idealities. Requiring a zero recall error is then equivalent to requiring the transfer offsets of the STO and RCL operations be identical but opposite.

d) An element, called a "comparator", for comparing the amount of charge on a capacitor with a threshold, and assigning a value "1" to the output bit if the amount of charge is smaller than that threshold, and a value of "0" otherwise.

Figure 4A:
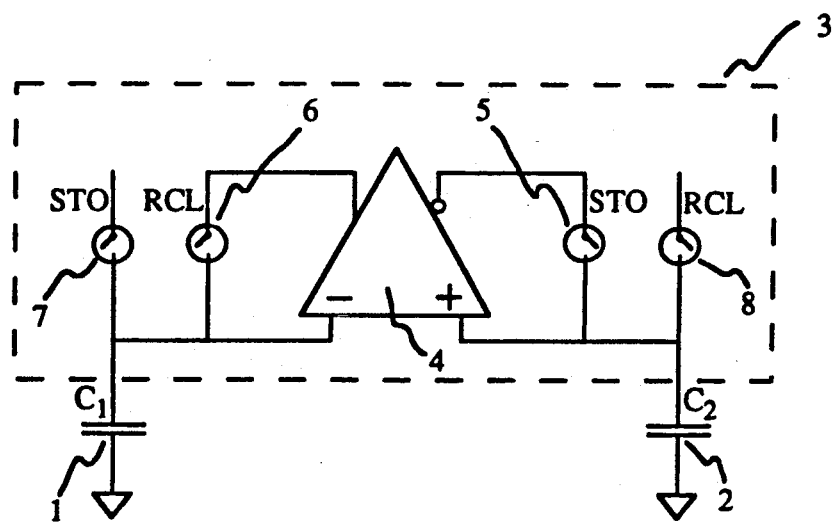
FIGS. 4(a)-4(b) illustrate a CMOS implementation as one embodiment of the bi-directional replication element in accordance with the present invention.
Figure 4:
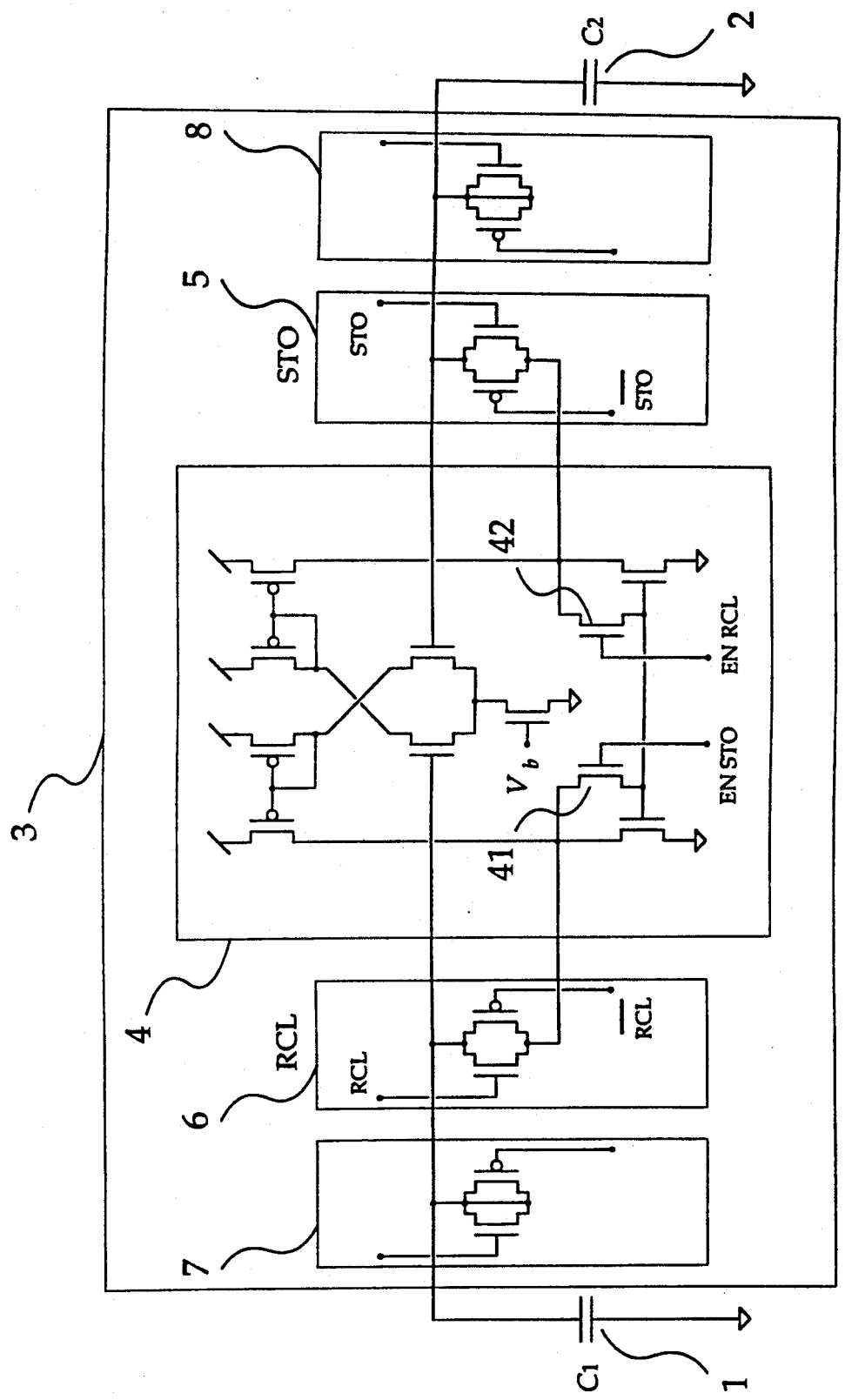

Specific circuit implementations of switching and comparing elements in various VLSI technologies are well-known in the art. One embodiment CMOS implementation of the BRE 3 of FIG. 3 that has a zero recall error, independent of process errors, is shown in FIG. 4(a). The circuit consists of a differential operational transconductance amplifier (OTA) 4 with inverting and non-inverting high-impedance outputs. Coupled to OTA 4 are STO switch 5 and RCL switch 6. The circuit may optionally include dummy switches 7 and 8 for compensation of charge injection due to clock feedthrough in switches 5 and 6. A possible transistor-level schematic of the BRE shown in FIG. 4(a) with a simple topology is illustrated in FIG. 4(b). Of course, those of ordinary skill in the art may envision various alterations and additions to improve output impedance, gain, speed or other characteristics of the OTA, such as by using cascoded transistor pairs in the output stage. Only one of the two OTA outputs is enabled at one time; the other output is then disabled. The state of the enable switches ENSTO 41 and ENRCL 42 determine the selected output. In STO mode the STO switch 5 is activated while the inverting output is enabled (ENSTO 41 active); in RCL mode the RCL switch 6 is activated while the non-inverting output is enabled (ENRCL 42 active). The transistor mismatches in the OTA 4 induce a transfer offset for both the STO and RCL active operations. However, these offsets are nearly equal but opposite because the input-referred offset voltage of the OTA 4 is identical for the inverting and non-inverting outputs, provided the outputs are high-impedance, due to the topology of the transistors shown in FIG. 4(b). Hence, the net loop offset for consecutive STO and RCL operations is about zero. Likewise, a replication circuit with zero or small recall error in other implementation technologies may be derived using similar principles.

Figure 5A:
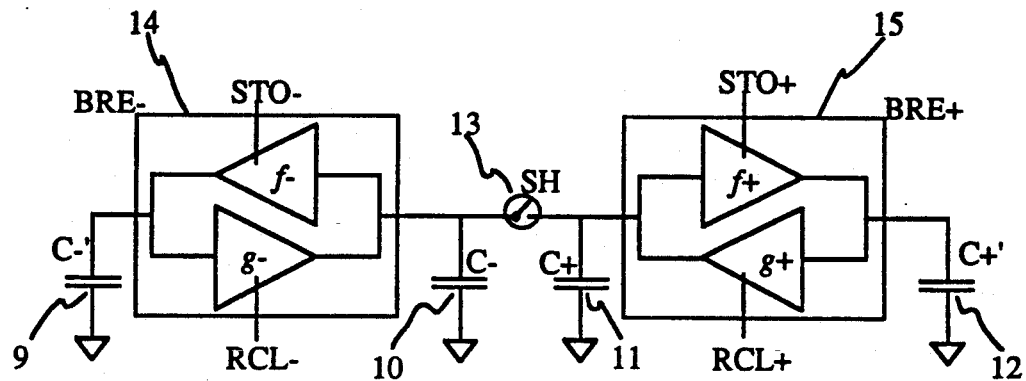
FIGS. 5(a)-5(b) show the block diagram and a specific CMOS implementation of a digital-to-analog converter utilizing bi-directional replication elements in accordance with one embodiment of the present invention.

Referring now to FIG. 5(a), a D/A converter in accordance with the present invention is illustrated. The circuit comprises four capacitors, $C^{-'}$ 9, $C^{-}$ 10, $C^{+}$ 11, and $C^{+'}$ 12, one switch SH 13, and two bi-directional replication elements, $BRE^{-}$ 14 and $BRE^{+}$ 15, in accordance with the above description. With respect to the above D/A conversion algorithm, the switch 13 and capacitors 10 and 11 serve the purpose of constructing a charge representing $U_i$ by averaging charges representing $U_i^+$ and $U_i^-$. Likewise, $BRE^{-}$ 14 with capacitor 9, as well as $BRE^{+}$ 15 with capacitor 12, function as analog charge storage registers for $U_i^+$ and $U_i^-$ respectively, able to store present values of $U_i$ for later recall. The loop error of successive store and recall operations by the bi-directional replication elements, inducing an offset in the register values, is the main source of error which affects the conversion differential linearity, and hence should be minimized as specified above.

With the circuit configuration of FIG. 5(a), the conversion algorithm translates in the following D/A conversion method, depicted symbolically below:

a) Initialization:
Precharge $C^{-}$ 10 to $Q_{ref}^{-}$, $C^{-'}$ 9 to $Q_{ref}^{-}$, $C^{+}$ 11 to $Q_{ref}^{+}$ and $C^{+'}$ 12 to $Q_{ref}^{+}$ such that:

| | |
|---|---|
| $Q_{ref}^{-} = f^{-}(Q_{ref}^{-})$ | $Q_{ref}^{-} = g^{-}(Q_{ref}^{-}));$ |
| $Q_{ref}^{+} = f^{+}(Q_{ref}^{+})$ | $(Q_{ref}^{+} = g^{+}(Q_{ref}^{+}));$ and |
| $Q_{ref}^{-} < Q_{ref}^{+}$ | |

Then share $Q_{ref}^{-}$ and $Q_{ref}^{+}$ on $C^{-}$ 10 and $C^{+}$ 11 by activating switch 13.

b) Algorithm Iteration:
From the first (MSB) to the last (LSB) bit, iterate:
If the bit is
"1": Activate $BRE^{-}$ 14 in STO mode (activate $STO^{-}$), activate $BRE^{+}$ 15 in RCL mode (activate $RCL^{+}$);
"0": Activate $BRE^{-}$ 14 in RCL mode (activate $RCL^{-}$), activate $BRE^{+}$ 15 in STO mode (activate $STO^{+}$);
Then share $Q^{-}$ and $Q^{+}$ on $C^{-}$ 10 and $C^{+}$ 11 by activating switch 13.

c) Termination:
The converted charge is represented by either of $Q^{-}$ on $C^{-}$ 10 or $Q^{+}$ on $C^{+}$ 11.

The precharging procedure of the initialization step can be performed in a number of ways, e.g., by charging capacitor 10 to $Q_{ref}^{-}$, capacitor 11 to $Q_{ref}^{+}$, with $Q_{ref}^{-}$ being less than $Q_{ref}^{+}$, and then activating both $BRE^{-}$ 14 and $BRE^{-}$ 15 in STO mode. Likewise, capacitor 9 can be charged to $Q^{-}ref$ and $BRE^{-}$ 14 activated in RCL mode instead, or capacitor 12 can be charged to $Q^{+}_{ref}$ and $BRE^{+}$ 15 activated in RCL mode. In addition to these schemes and combinations of those, different ones exist as well, and the choice of the precharging method does not affect the performance of the converter. A possible transistor-level CMOS implementation of the D/A converter of the invention, based on the BRE embodiment of FIG. 4(b), is given in FIG. 5(b), which also includes switches 51-54 assisting in the precharging procedure.

Figure 6A:
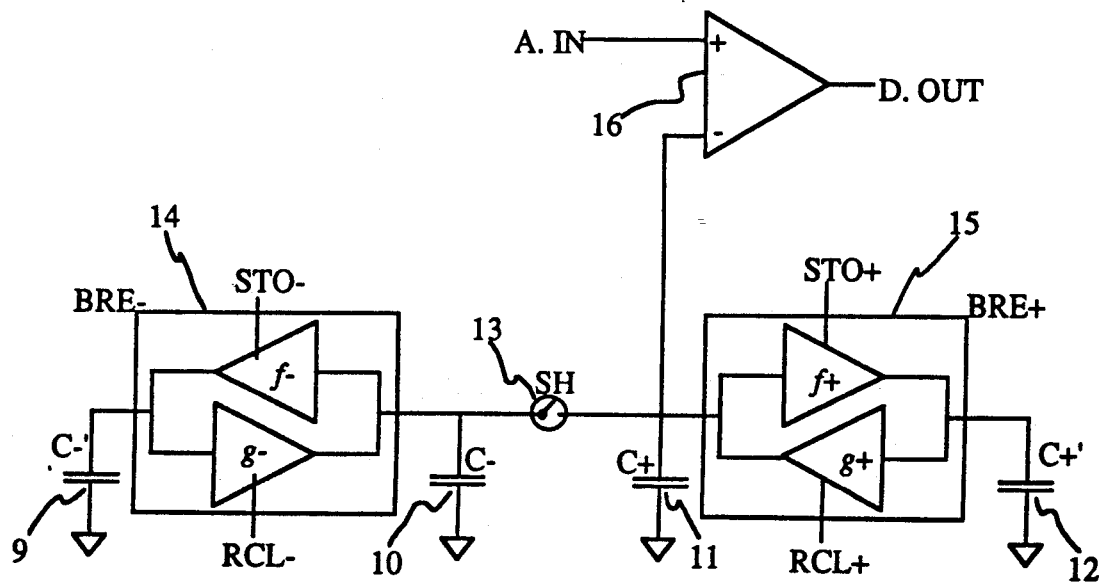
FIGS. 6(a)-6(b) show the block diagram and a specific CMOS implementation of an analog-to-digital converter which utilizes the digital-to-analog converter of the present invention.
Figure 5:
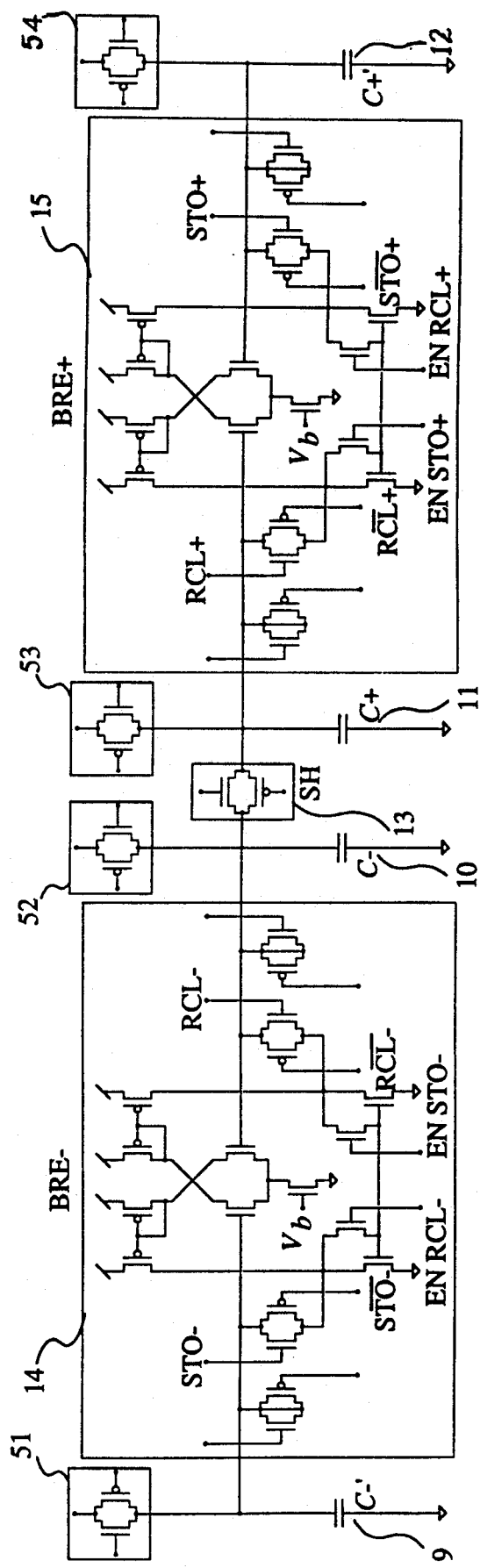

Referring next to FIG. 6(a), an A/D converter in accordance with the present invention is shown. The A/D converter comprises the D/A converter shown in FIG. 5(a) being further coupled to a comparator 16 which receives the analog input for conversion to a digital word. Coupled to either of the capacitors 10 and 11, the comparator senses the intermediate D/A conversion results which serve as the successive approximation values for comparison with the analog input. The results of comparison determine the digital output word in a sequence from MSB to LSB. In turn, the output bits synchronously feed into the D/A converter so as to provide the successive approximations. More specifically, the method of A/D conversion with the circuit of FIG. 6(a) consists of the following sequence of instructions:

a) Initialization:

Same initialization procedure as for D/A conversion described above.

b) Successive approximation:

For n successive steps, determine a new bit as follows:

Compare A.IN with Q+ on C+ 11 (or Q− on C− 10) (Evaluate the output D.OUT from the comparator, which is "1" if A.IN is the greater, and which is "0" otherwise);

Set the bit to D.OUT;

If the bit is

"1": Activate BRE− 14 in STO mode (activate STO−) activate BRE+ 15 in RCL mode (activate RCL+);

"0": Activate BRE− 14 in RCL mode (activate RCL−) activate BRE+ 15 in STO mode (activate STO+);

Then share Q− and Q+ by activating switch SH 13;

c) Termination:

The digital word is given by the sequence of the bits from b) in the order processed, the MSB first and the LSB last.

In principle, for the last iteration the replication and charge sharing instructions can be omitted, as by then the final bit has been determined. However, the instructions following the assignment of the LSB value should be completed in case the final approximation analog value, corresponding to the converted digital word, is required.

FIG. 6(b) shows a possible transistor-level CMOS implementation of the A/D converter of the invention, based on the D/A converter embodiment of FIG. 5(b). The comparator circuit 16 contains a cross-coupled transistor output stage for latched operation; a high pulse on the RST gate 61 triggers the comparison and fixes the output D.OUT at the falling pulse edge.

Alternative Embodiments

As described above, the present invention may be implemented in various technologies and with different component structures. In technology environments where a direct relationship exists between charge and voltage with respect to the charge holding devices, the references to charge in the above description apply equally to voltage. In such a case the charge holding devices can be characterized as "capacitors" in the true sense of the term. Examples of embodiments of the invention implemented in CMOS technology with capacitive analogues for the charge holding devices are given in FIGS. 5(b) and 6(b). The detailed component structure of these circuits allows for countless variations that each may address different performance requirements, such as speed, compactness, power, accuracy, and etc. As a proof of concept, the A/D and D/A converters in accordance with the present invention have been implemented and tested on a VLSI chip in 2 $\mu$m CMOS technology, using circuitry roughly similar to that depicted in FIG. 6(b). Both converters, of a size smaller than 300 $\mu$m by 300 $\mu$m, provide a ±0.6 LSB differential non-linearity at 8-bit resolution, at a 50 KHz sampling rate and at 200 $\mu$W power dissipation. No trimming of individual components or selection of a particular "fortunate" converter across different dies was needed to obtain these results, which illustrates the robustness of the converter architecture in the presence of process non-idealities, necessary for high yield in a VLSI environment. This robustness is extremely useful in applications requiring a dense integration of a multitude of D/A and A/D converters where the size constraint is significant and where individual trimming of individual components to compensate for process offsets and mismatches is virtually impossible.

Figure 7:
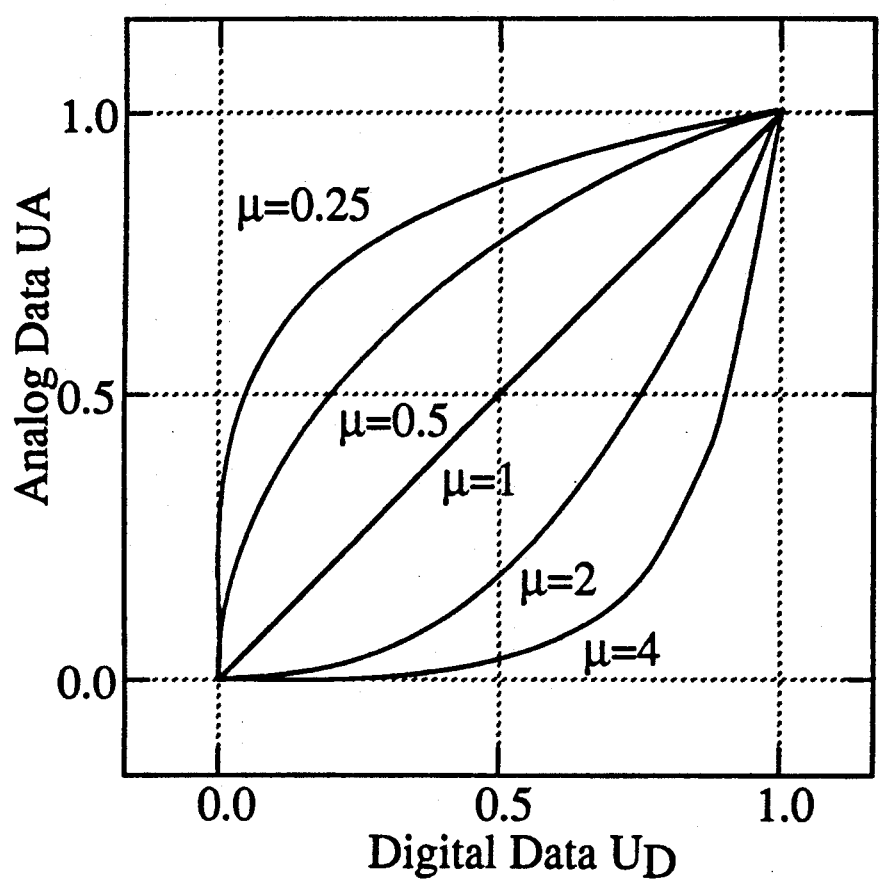
FIG. 7 illustrates conversion transfer characteristic curves for various values of the capacitor ratio utilized in alternative embodiments of the present invention.

An important feature of the converters of the present invention, as mentioned above, is their guaranteed differential conversion linearity regardless of their degree of integral conversion non-linearity. A mismatch in the size between capacitors 10 and 11 results in an unequal redistribution of the total charge under the sharing operation of the conversion method, giving rise to a curved, but still monotonic conversion transfer characteristic. The nonlinear relation mapping the digital ($U_D$) and analog ($U_A$) representation values of the conversion approximately obeys a functional form of the type $U_A = (U_D)^\mu$ with the exponent $\mu$ given by the ratio of the capacitance of capacitors 10 and 11, C−/C+. Whereas for certain, mostly linear signal processing applications the integral conversion linearity is a strict requirement, for other applications the nonlinear distortion induced by the conversion is to a large extent irrelevant, or is even desirable for an optimal data representation in case the distribution of the conversion samples is highly non-uniform over the input range of the converter. In the latter case, an intentional nonlinear conversion characteristic, to expand the conversion input range in dense regions of higher frequency of occurrence, can be obtained by a proper selection of the size ratio of the capacitors. In particular, a pseudo-logarithmic compression results from a capacitor size ratio larger than 2:1 as illustrated in FIG. 7.

Another attractive feature concerns the successive-approximation A/D conversion scheme of the invention. The combination of concurrent A/D and D/A conversion operations in a single architecture provides the final successive approximation as an analog output along with the digital conversion output. The value of this analog output, one value for each digital output of the converter, corresponds to the typical, ideal analog quantity at the converter input yielding that digital output. Hence, the analog output of the combined converter maps an arbitrary analog input value to its closest discrete value, with the spectrum of discrete outputs determined by the resolution and operational range of the converter. This discretization property proves very useful in e.g., the implementation of noise-tolerant dynamic refresh schemes for multi-valued analog capacitive memories. Self-refreshing analog memories, incorporating capacitor banks and the A/D converters of the present invention, can be constructed with limited additional circuitry. Such circuitry serves to overwrite, at a given instant, the voltage across a selected capacitor with the final approximation voltage obtained from an A/D conversion of the voltage across that capacitor prior to refresh.

Figure 6:
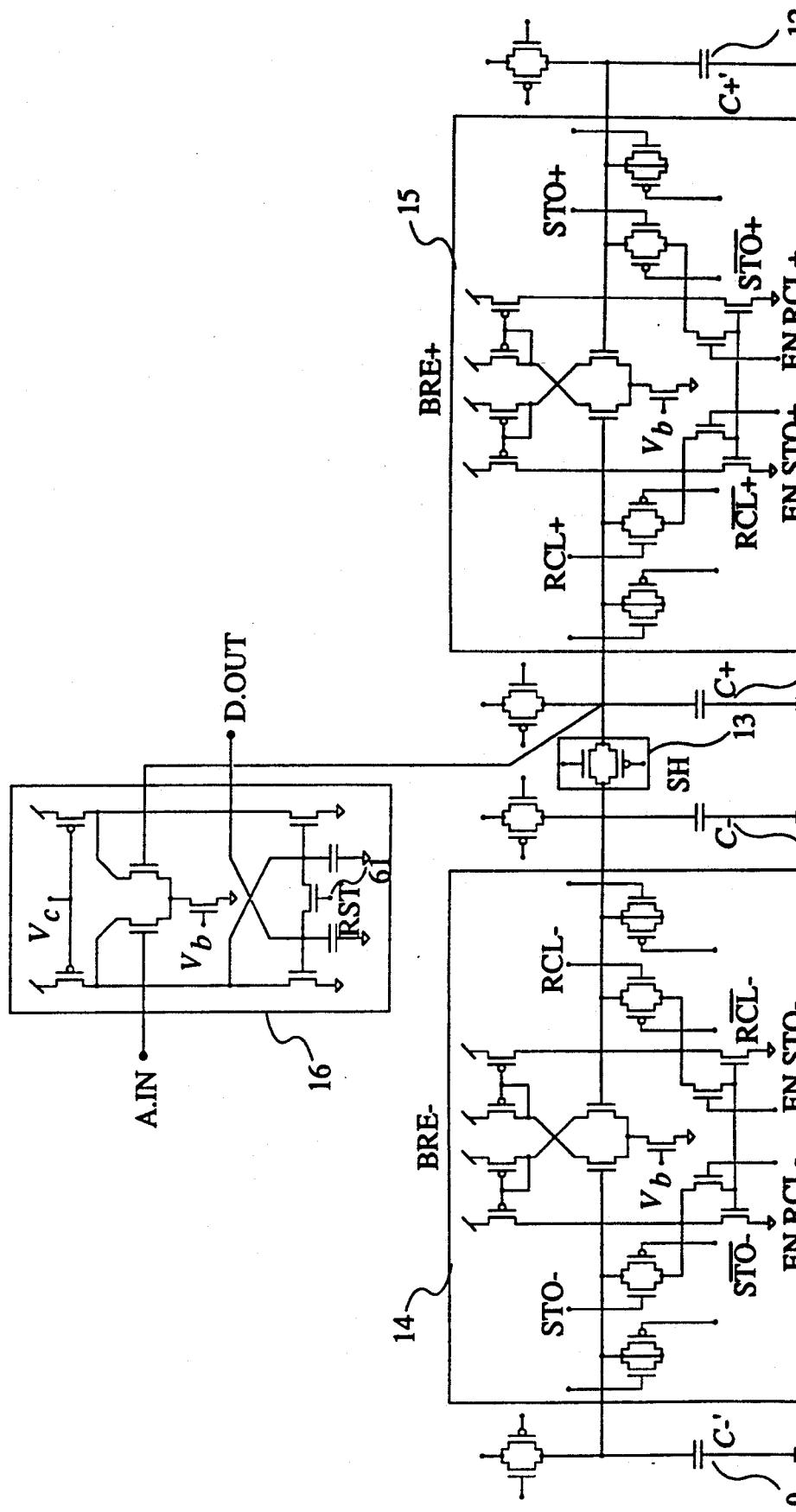
Figure 8:
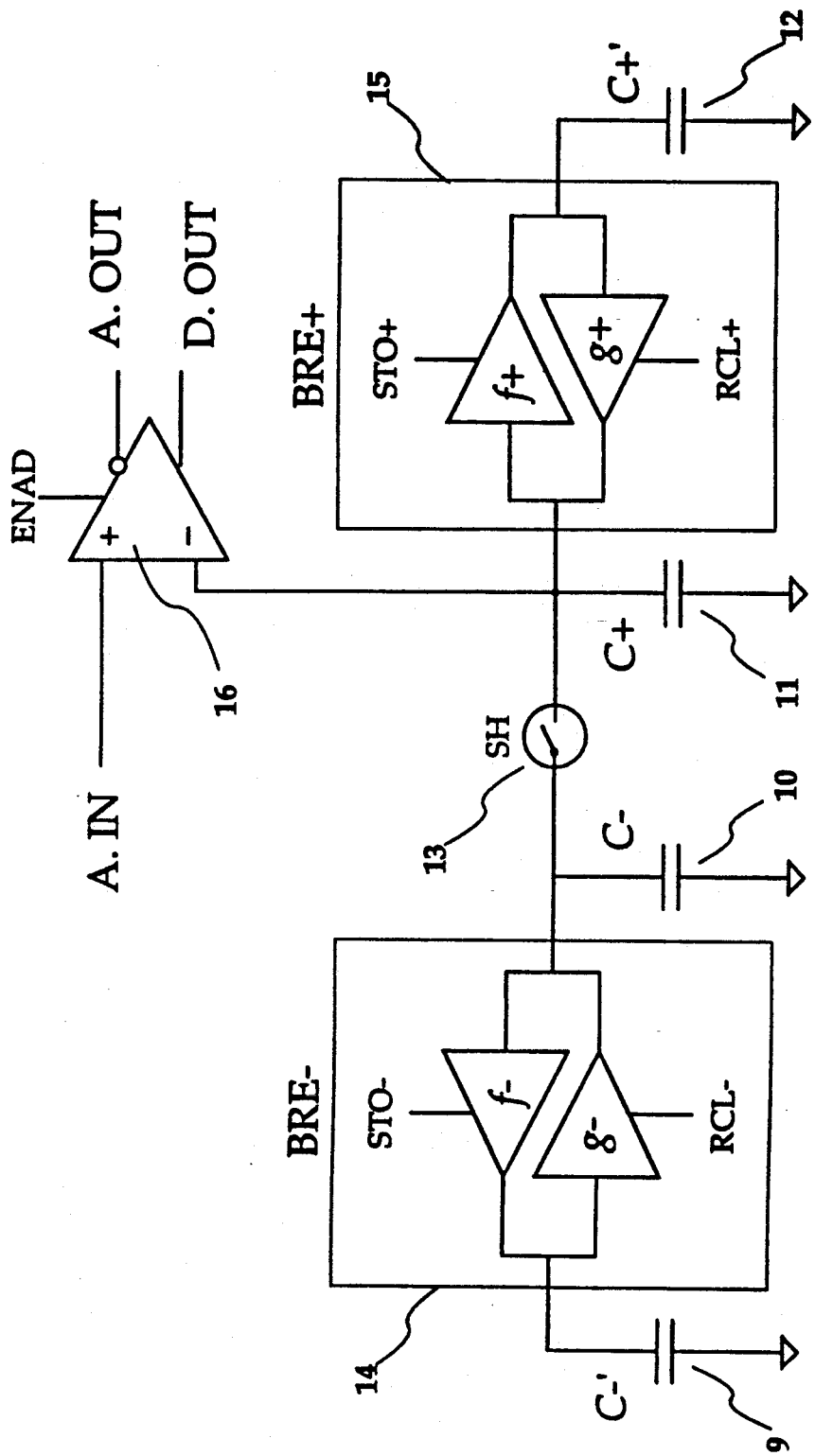
FIGS. 8(a)-8(b) show the block diagram and a specific CMOS implementation of a combined digital-to-analog and analog-to-digital converter with matched conversion characteristics in accordance with another embodiment of the present invention.
Figure 8:
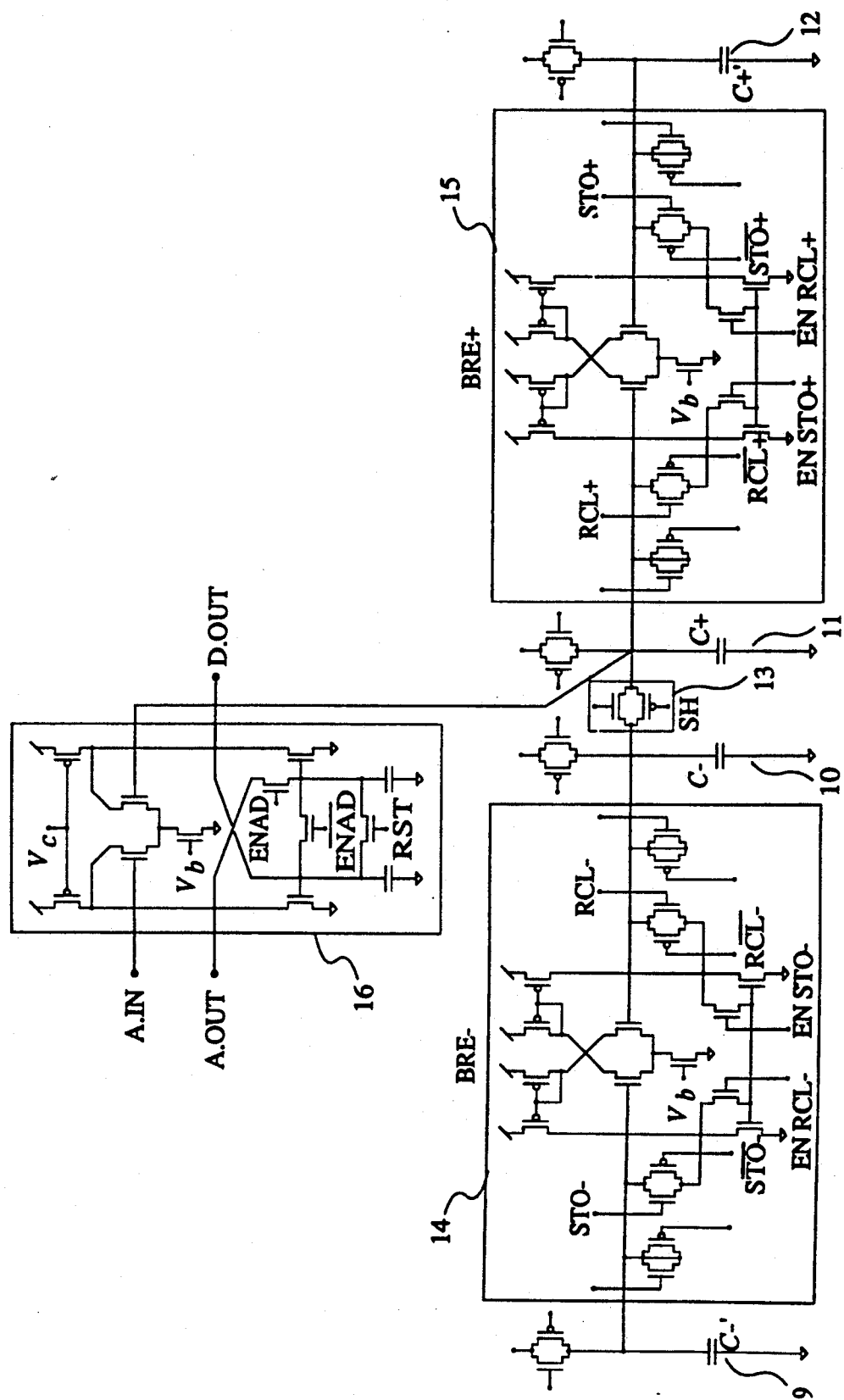

A useful feature directly related to the previous one concerns the versatility of the converter apparatus, capable of performing both A/D and D/A conversions within a single structure. The D/A converter internal to the A/D converter of FIG. 6 can in principle be addressed individually. Thus, bi-directional conversion of data between the analog and digital domains is possible with this invention. For the purpose of such random-access data transfer between analog and digital formats, the combined A/D and D/A converter of the invention is especially attractive as it provides almost perfectly matched transfer characteristics for conversion between both formats, in analog and digital directions. To ensure perfect matching between both directions of conversion, the comparator output may be complemented with an extra inverting high-impedance transconductance output, as shown in FIG. 8(a). Such output allows a negative feedback connection to the analog input node A.IN of comparator 16 providing an analog output which matches the input offset of the comparator when the connection is established. A possible detailed structure for the resulting combined A/D and D/A converter in CMOS technology, based on the structures of FIGS. 5(b) and 6(b), is shown in FIG. 8(b). The ENAD logic signal and its complement control the operation mode of the converter: A/D conversion mode (D.OUT active; latched comparator enabled) is achieved when ENAD is high; D/A conversion mode (A.OUT active; negative feedback enabled) is obtained with ENAD low.

In addition to the above alternative embodiments of the present invention, various alterations may be made by those skilled in the art without departing from the spirit and scope of the invention. The invention should therefore be measured in terms of the claims which follow.

We claim:

1. A digital-to-analog converter comprising:
   first and second charge holding means each capable of holding an electric charge;
   switching means coupled to said first and second charge holding means, said switching means when activated electrically coupling said first and second charge holding means for sharing and redistributing the charge contained by said first and second charge holding means with approximately equal charge density;
   third and fourth charge holding means each capable of holding an electric charge;
   a first bi-directional replication element coupled between said first charge holding means and said third charge holding means, said first bi-directional replication element having a store mode and a recall mode of operation, said first bi-directional replication element establishing a charge on said third charge holding means corresponding to the charge stored on said first charge holding means determined by a first transfer function when said first bi-directional replication element is operated in store mode, said first bi-directional replication element establishing a charge on said first charge holding means corresponding to the charge stored on said third charge holding means determined by a second transfer function when said first bi-directional replication element is operated in recall mode; and
   a second bi-directional replication element coupled between said second charge holding means and said fourth charge holding means, said second bi-directional replication element having a store mode and a recall mode of operation, said second bi-directional replication element establishing a charge on said fourth charge holding means corresponding to the charge stored on said second charge holding means determined by a third transfer function when said second bi-directional replication element is operated in store mode, said second bi-directional replication element establishing a charge on said second charge holding means corresponding to the charge stored on said fourth charge holding means determined by a fourth transfer function when said second bi-directional replication element is operated in recall mode.

2. The digital-to-analog converter of claim 1 wherein said first, second, third and fourth charge holding means comprise first, second, third and fourth capacitors, respectively, each having one terminal coupled to a fixed potential.

3. The digital-to-analog converter of claim 1 wherein said first bi-directional replication element comprises:
   a first operational transconductance amplifier having first and second inputs and first and second outputs, said first input coupled to said first charge holding means and said second input coupled to said third charge holding means, said first output being non-inverting with respect to said first input and inverting with respect to said second input and said second output being inverting with respect to said first input and non-inverting with respect to said second input;
   a first store switch coupled between said first output of said first amplifier and said third charge holding means; and
   a first recall switch coupled between said second output of said first amplifier and said first charge holding means,
   whereby said first bi-directional replication element is operated in store mode when said first store switch is activated while said first output of said first amplifier is enabled, and is operated in recall mode when said first recall switch is activated while said second output of said amplifier is enabled.

4. The digital-to-analog converter of claim 3 wherein said second bi-directional replication element comprises:
   a second operational transconductance amplifier having first and second inputs and first and second outputs, said first input of said second amplifier being coupled to said second charge holding means and said second input of said second amplifier being coupled to said fourth charge holding means, said first output being non-inverting with respect to said first input and inverting with respect to said second input and said second output being inverting with respect to said first input and non-inverting with respect to said second input;
   a second store switch coupling said first output of said second amplifier to said fourth charge holding means; and
   a second recall switch coupling said second output of said second amplifier to said second charge holding means,
   whereby said second bi-directional replication element is operated in store mode when said second store switch is activated while said first output of said second amplifier is enabled, and is operated in recall mode when said second recall switch is activated while said second output of said second amplifier is enabled.

5. The digital-to-analog converter of claim 4 wherein said first and second inputs of said first and second amplifiers are inverting and non-inverting inputs respectively and said first and second outputs of said first and second amplifiers are inverting and non-inverting outputs respectively.

6. The digital-to-analog converter of claim 4 further comprising a plurality of dummy charge injection switches each coupled to any of said charge holding means.

7. The digital-to-analog converter of claim 4 further comprising a plurality of precharging switches each coupled to any of said charge holding means.

8. The digital-to-analog converter of claims 1, 4, 5 or 6 further comprising a comparator coupled to said first charge holding means for sensing an amount of charge held thereon, said comparator receiving an analog input signal, said comparator comparing the magnitude of said analog input signal with that of said amount of charge, said comparator displaying a first output state if the analog input signal has the greater magnitude, otherwise displaying a second output state, whereby said digital-to-analog converter with said comparator functions as a successive approximation analog-to-digital converter.

9. The apparatus of claim 8 wherein said comparator is coupled to said second charge holding means instead of to said first charge holding means, whereby said amount of charge is sensed on said second charge holding means instead of on said first charge holding means.

10. The apparatus of claim 8 wherein said comparator includes an inverting transconductance output for providing negative feedback to said analog input signal of said comparator.

11. In a digital-to-analog converter comprising first and second charge holding means coupled by a charge sharing means, a first bi-directional replication element coupled between a third charge holding means and said first charge holding means and a second bi-directional replication element coupled between a fourth charge holding means and said second charge holding means, the method of performing digital-to-analog conversion comprising the steps of:

establishing first, second, third and fourth reference charges on said first, second, third and fourth charge holding means, respectively;

sharing the charges on said first and second charge holding means by activating said charge sharing means; and iterating for each bit of a digital word to be converted from the most significant bit to the least significant bit and for each bit performing the following steps:

activating the first bi-directional replication element in recall mode and the second bi-directional replication element in store mode if the bit is in a first logic state;

activating the first bi-directional replication element in store mode and the second bi-directional replication element in recall mode if the bit is in a second logic state; and subsequently sharing the charges on said first and second charge holding means by activating said charge sharing means, whereby the final charge resulting on either said first or second charge holding means is the analog equivalent to the digital word being translated.

12. In an analog-to-digital converter comprising first and second charge holding means coupled by a charge sharing means, a first bi-directional replication element coupled between a third charge holding means and said first charge holding means, a second bi-directional replication element coupled between a fourth charge holding means and said second charge holding means and a comparator for comparing an analog input to a charge contained on either said first or second charge holding means, said comparator displaying a first logic state if said analog input is the greater and displaying a second logic state otherwise, the method of converting said analog input to a digital word comprising the steps of:

establishing first, second, third and fourth reference charges on said first, second, third and fourth charge holding means, respectively;

sharing the charges on said first and second charge holding means by activating said charge sharing means; and iterating for the desired number of bits of the digital word and determining each bit in sequence from the most significant to the least significant by performing the following steps:

determining the current bit value, given by the logic state displayed by said comparator as the result of comparing said analog input with the charge stored on said first or second charge holding means;

activating the first bi-directional replication element in recall mode and the second bi-directional replication element in store mode if the bit is in said first logic state;

activating the first bi-directional replication element in store mode and the second bi-directional replication element in recall mode if the bit is in said second logic state; and subsequently sharing the charges on said first and second charge holding means by activating said charge sharing means, whereby the bits of said digital word corresponding to said analog input are given by the sequence of assigned bit values, proceeding from the most significant bit to the least significant bit.

13. In a digital-to-analog converter comprising first, second, third and fourth charge holding means, the method of performing digital-to-analog conversion comprising the steps of:

establishing first, second, third and fourth reference charges on said first, second, third and fourth charge holding means, respectively;

averaging the charge density on said first and second charge holding means; and iterating for each bit of a digital word to be converted:

replicating the charge from said third to said first charge holding means according to a first recall transfer function and replicating the charge from said second to said fourth charge holding means according to a second store transfer function, if the bit is in a first logic state;

replicating the charge from said first to said third charge holding means according to a first store transfer function and replicating the charge from said fourth to said second charge holding means according to a second recall transfer function, if the bit is in a second logic state; and subsequently averaging the charge density on said first and second charge holding means, whereby the final charge resulting on either said first or second charge holding means is the analog equivalent to the digital word being translated.

14. In an analog-to-digital converter comprising first, second, third and fourth charge holding means, the method of converting an analog input to a digital word comprising the steps of:

establishing first, second, third and fourth reference charges on said first, second, third and fourth charge holding means, respectively;

averaging the charge density on said first and second charge holding means; and iterating for the desired number of bits of the digital word and determining each bit in sequence from the most significant to the least significant by performing the following steps:

comparing said analog input with the charge stored on said first or second charge holding means and assigning a first logic state to the current bit value if said analog input is the greater and assigning a second logic state otherwise;

replicating the charge from said third to said first charge holding means according to a first recall transfer function and replicating the charge from said second to said fourth charge holding means according to a second store transfer function, if the bit is in said first logic state;

replicating the charge from said first to said third charge holding means according to a first store transfer function and replicating the charge from said fourth to said second charge holding means according to a second recall transfer function, if the bit is in said second logic state; and subsequently averaging the charge density on said first and second charge holding means, whereby the bits of said digital word corresponding to said analog input are given by the sequence of assigned bit values, proceeding from the most significant bit to the least significant bit.

15. The method of claims 12 or 14 further comprising the step of suspending the iteration steps following the completion of the final bit assignment.

16. The apparatus of claim 9 wherein said comparator includes an inverting transconductance output for providing negative feedback to said analog input signal of said comparator.

* * * * *